United States Patent
Piirainen

(10) Patent No.: US 7,920,635 B2
(45) Date of Patent: Apr. 5, 2011

(54) METHOD, CLIPPER MODULE, AND TRANSMITTER

(75) Inventor: Olli Piirainen, Oulu (FI)

(73) Assignee: Nokia Corporation, Espoo (FI)

( * ) Notice: Subject to any disclaimer, the term of this patent is extended or adjusted under 35 U.S.C. 154(b) by 783 days.

(21) Appl. No.: 11/892,963

(22) Filed: Aug. 28, 2007

(65) Prior Publication Data

US 2008/0089439 A1 Apr. 17, 2008

(30) Foreign Application Priority Data

Oct. 12, 2006 (FI) .................................... 20065649

(51) Int. Cl.
*H04L 27/28* (2006.01)
(52) U.S. Cl. ...................................................... 375/260
(58) Field of Classification Search ................. 375/214, 375/260, 295, 296; 327/180, 309, 310, 317, 327/331
See application file for complete search history.

(56) References Cited

U.S. PATENT DOCUMENTS

| | | | |
|---|---|---|---|
| 2003/0219079 A1 | 11/2003 | Piirainen et al. | |
| 2004/0146106 A1* | 7/2004 | De Lameillieure | 375/240.12 |
| 2006/0030352 A1* | 2/2006 | Kiran et al. | 455/522 |
| 2006/0250936 A1* | 11/2006 | Chen et al. | 370/208 |
| 2007/0254592 A1* | 11/2007 | McCallister et al. | 455/67.11 |

FOREIGN PATENT DOCUMENTS

| | | |
|---|---|---|
| EP | 1195892 | 4/2002 |
| GB | 2418087 A1 | 3/2006 |
| WO | 2006/072699 A1 | 7/2006 |

OTHER PUBLICATIONS

Tellado-Mourelo, Jose "Peak to Average Power Reduction for Multicarrier Modulation," Ph.D. Thesis, Stanford University, Sep. 1999.
Hill, G. et al.: "Comparison of low complexity clipping algorithms for OFDM" Personal, Indoor and Mobile Radio Communications, 2002. The 13th IEEE International Symposium on Sep. 15-18, Piscataway, NJ, USA. pp. 227-231, whole document.
International Search Report, PCT/FI2007/050546, filed Oct. 10, 2007.

* cited by examiner

*Primary Examiner* — Sam K Ahn
(74) *Attorney, Agent, or Firm* — Squire, Sanders & Dempsey (US) LLP

(57) ABSTRACT

There is provided a method of clipping a transmission signal. The method comprises: providing a residual signal of a complex envelope clipper based on the transmission signal to be clipped; providing a reference signal respective to the residual signal, the reference signal corresponding to an ideal residual signal; forming a clipping signal on the basis of the residual signal and the reference signal; subtracting the clipping signal from the residual signal for removing higher amplitudes of the residual signal; and subtracting the clipping signal from the reference signal for providing a reference signal respective to the clipped residual signal.

33 Claims, 3 Drawing Sheets

METHOD, CLIPPER MODULE, AND TRANSMITTER

FIELD

The invention relates to a method of clipping a transmission signal, to a clipper module, to a transmitter, to a computer program product, and to a computer-readable medium.

BACKGROUND

A peak-to-average power ratio (PAR) of wireless transmit signals is rather high in current radio systems and it is highly desirable to find ways to reduce it without reducing the radio link performance in order to improve the efficiency of the transmitter equipment. The efficiency of a power amplifier of a base station transmitter in a radio system depends on a peak-to-average power ratio of the transmitted signal. The lower the PAR, the better the power amplifier efficiency can be.

An often-used method for reducing PAR is clipping in which high amplitude values of the transmitted signal are clipped and an error is created in the transmitted signal. The amount of the created error is limited by such as error vector magnitude (EVM) and PCDE (peak code domain error) requirements as well as by the requirements for spectrum emission masks (SEM). Several types of iterative clippers have been considered for OFDM (orthogonal frequency division multiplexing) clipping, for example, in J. Tellado: "Peak-to-Average Power Reduction for Multicarrier modulation", Ph.D. thesis, Stanford University, September 1999. Further, an example of a WCDMA (wideband code division multiple access) clipper algorithm solution is described in US 2003/0219079.

One problem with the existing clipper solutions is that as the PAR value of the transmitted signal is reduced, the created error value increases at the same time. Thus, there is a need to find new iterative clippers that could perform better than the existing algorithms and with reasonable complexity.

BRIEF DESCRIPTION OF THE INVENTION

An object of the invention is to provide an improved method of clipping a transmission signal, an improved clipper module, an improved transmitter, an improved computer program product, and an improved computer-readable medium.

According to an aspect of the invention, there is provided a method of clipping a transmission signal. The method comprises: providing a residual signal of a complex envelope clipper based on the transmission signal to be clipped; providing a reference signal respective to the residual signal, the reference signal corresponding to an ideal residual signal; forming a clipping signal on the basis of the residual signal and the reference signal; subtracting the clipping signal from the residual signal for removing higher amplitudes of the residual signal; and subtracting the clipping signal from the reference signal for providing a reference signal respective to the clipped residual signal.

According to another aspect of the invention, there is provided a clipper module, comprising: a calculator for forming a clipping signal on the basis of a residual signal of a complex envelope clipper and a respective reference signal thereof, the residual signal being based on a transmission signal to be clipped, and the respective reference signal corresponding to an ideal residual signal; an adder for subtracting the clipping signal from the residual signal for removing higher amplitudes of the residual signal; and an adder for subtracting the clipping signal from the reference signal for providing a reference signal respective to the clipped residual signal.

According to another aspect of the invention, there is provided a transmitter comprising one or more clipper modules, the transmitter comprising: a transmitter unit for transmitting the clipped transmission signal.

According to another aspect of the invention, there is provided a computer program product encoding a computer program of instructions for executing a computer process for clipping a transmission signal. The process comprises: providing a residual signal of a complex envelope clipper based on the transmission signal to be clipped; providing a reference signal respective to the residual signal, the reference signal corresponding to an ideal residual signal; forming a clipping signal on the basis of the residual signal and the reference signal; subtracting the clipping signal from the residual signal for removing higher amplitudes of the residual signal; and subtracting the clipping signal from the reference signal for providing a reference signal respective to the clipped residual signal.

According to another aspect of the invention, there is provided a computer-readable medium having stored thereon a data structure, comprising instructions for executing a computer process for clipping a transmission signal. The process comprises: providing a residual signal of a complex envelope clipper based on the transmission signal to be clipped; providing a reference signal respective to the residual signal, the reference signal corresponding to an ideal residual signal; forming a clipping signal on the basis of the residual signal and the reference signal; subtracting the clipping signal from the residual signal for removing higher amplitudes of the residual signal; and subtracting the clipping signal from the reference signal for providing a reference signal respective to the clipped residual signal.

According to another aspect of the invention, there is provided a clipper module, comprising: calculating means for forming a clipping signal on the basis of a residual signal of a complex envelope clipper and a respective reference signal thereof, the residual signal being based on a transmission signal to be clipped, and the respective reference signal corresponding to an ideal residual signal; subtracting means for subtracting the clipping signal from the residual signal for removing higher amplitudes of the residual signal; and subtracting means for subtracting the clipping signal from the reference signal for providing a reference signal respective to the clipped residual signal.

The invention provides several advantages. Better performance is achieved with smaller complexity. The solution is suitable for many real implementations. Lower PAR values are achieved without increasing the error values.

LIST OF DRAWINGS

In the following, the invention will be described in greater detail with reference to the embodiments and the accompanying drawings, in which FIG. 1 shows an example of a data transmission system;

DESCRIPTION OF EMBODIMENTS

Figure 1:
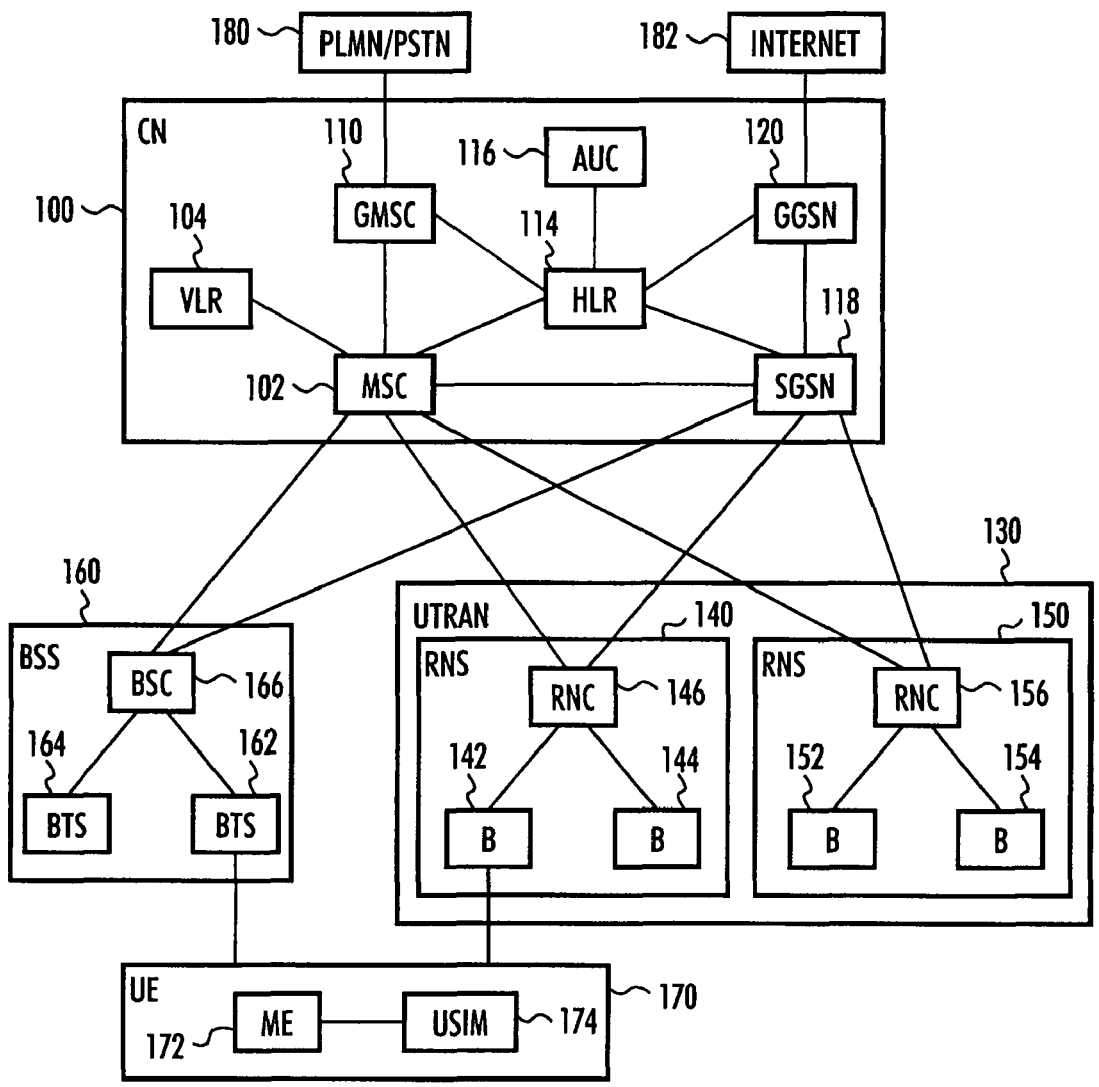

With reference to FIG. 1, examine an example of a data transmission system in which the preferred embodiments of the invention can be applied. FIG. 1 is a simplified block diagram that describes the most important parts of the radio systems on the network element level. The structure and functions of the network elements are not described in detail, because they are commonly known. The described solution may be applied in digital TDMA, FDMA and CDMA radio systems, although it is not restricted to them.

In FIG. 1, a core network CN 100 represents the radio independent layer of the telecommunications system. The radio systems are shown as a first radio system, i.e. radio access network 130, and a second radio system, i.e. base station system BSS 160. In addition, the figure shows user equipment UE 170. The term UTRAN comes from the words UMTS Terrestrial Radio Access Network, i.e. the radio access network 130 is implemented using wide-band code division multiple access WCDMA. The base station system 160 is implemented using time division multiple access TDMA.

Generally, it is also possible to define that a radio system comprises user equipment, also known as a user device or a mobile phone, and a network part that contains the radio access network or base station system of the fixed infrastructure of the radio system.

The structure of the core network 100 corresponds to a combined GSM and GPRS system structure. The GSM network elements are responsible for providing circuit-switched connections and the GPRS network elements are responsible for providing packet-switched connections, some of the network elements being, however, included in both systems.

A mobile services switching centre MSC 102 is the midpoint of the circuit-switched side of the core network 100. One and the same mobile services switching centre 102 can be used to serve the connections of both the radio access network 130 and the base station system 160. The tasks of the mobile services switching centre 102 include switching, paging, location registration, handover management, collecting subscriber billing information, encryption parameter management, frequency allocation management, and echo cancellation. The number of mobile services switching centres 102 may vary: a small network operator may have only one mobile services switching centre 102, but large core networks 100 usually have several.

Large core networks 100 can have a separate gateway mobile services switching centre GMSC 110 that takes care of the circuit-switched connections between the core network 100 and external networks 180. The gateway mobile services switching centre 110 is located between the mobile ser-vices switching centres 102 and the external networks 180. An external network 180 can be a public land mobile network PLMN or public switched telephone network PSTN, for instance.

A home location register HLR 114 contains a permanent subscriber register, i.e. the following information, for instance: an international mobile subscriber identity IMSI, mobile subscriber ISDN number MSISDN, authentication key, and when the radio system supports GPRS, a PDP (Packet Data Protocol) address.

A visitor location register VLR 104 contains user equipment 170 roaming information in the area of the mobile services switching centre 102. The visitor location register 104 contains mainly the same information as the home location register 114, but the information is only temporarily in the visitor location register 104.

An authentication centre AuC 116 always resides physically at the same location as the home location register 114 and contains an individual subscriber authentication key Ki, a ciphering key CK and the corresponding IMSI.

The network elements in FIG. 1 are functional entities whose physical implementation may vary. Ordinarily, the mobile services switching centre 102 and visitor location register 104 form one physical device, and the home location register 114 and authentication centre 116 another physical device.

A serving GPRS support node SGSN 118 is the midpoint of the packet-switched side of the core network 100. The main task of SGSN 118 is to transmit packets to and receive them from user equipment 170 supporting packet-switched transmission by using the radio access network 130 or base station system 160. SGSN 118 contains subscriber and location information concerning the user equipment 170.

A gateway GPRS Support Node GGSN 120 is the packet-switched side counterpart to the gateway mobile services switching centre 110 of the circuit-switched side, with the difference, however, that GGSN 120 must also be capable of routing traffic from the core network 100 to external networks 182, whereas GMSC 110 only routes incoming traffic. In our example, the Internet represents the external networks 182.

The first radio system, i.e. radio access network 130, comprises radio network subsystems RNS 140, 150. Each radio network subsystem 140, 150 comprises radio network controllers RNC 146, 156 and Nodes B 142, 144, 152, 154. The Node B is a rather abstract concept, and often the term base station is used instead of it.

The radio network controller 146 controls the Nodes B 142, 144. In principle, the aim is that the devices providing the radio path and the related functions reside in the Nodes B 142, 144 and the control devices reside in the radio network controller 146.

The radio network controller 146 takes care of the following tasks, for instance: radio resource management of the Node B 142, 144, inter-cell handovers, frequency management, i.e. the allocation of frequencies to the Nodes B 142, 144, management of frequency hopping sequences, measurement of time delays on the uplink, provision of the operation and maintenance interface, and power control.

The Node B 142, 144 comprises one or more transceivers, with which the WDCMA radio interface is provided. The Node B serves one cell, but it can also serve several sectored cells. The diameter of a cell may vary from a few meters to dozens of kilometers. The tasks of the Node B 142, 144 include: timing advance calculation, uplink measurements, channel coding, encryption and decryption.

The second radio system, i.e. base station system 160, comprises a base station controller BSC 166 and base stations BTS 162, 164. The base station controller 166 controls the base stations 162, 164. In principle, the aim is that the devices providing the radio path and the related functions reside in the base stations 162, 164 and the control devices reside in the base station controller 166. The base station controller 166 takes care of essentially the same tasks as the radio network controller.

The base station 162, 164 contains at least one transceiver that provides one carrier, i.e. eight time slots, i.e. eight physical channels. Typically, one base station 162, 164 serves one cell, but it can also serve several sectored cells. The base station 162, 164 also comprises a transcoder that converts between the speech coding formats used in the radio system and the public telephone network. However, in practice, the transcoder usually resides physically in the mobile services switching centre 102. The tasks of the base station 162, 164 correspond to those of the Node B.

Both Node B 142, 144 and base station 162, 164 may utilise spatial diversity, i.e. use an array antenna in the signal reception (and also transmission). An antenna array may comprise a plural number of antenna elements that are physically separate from each other. The received signals are combined in diversity receivers using a suitable combining method.

The user equipment 170 comprises two parts: mobile equipment ME 172 and UMTS subscriber identity module USIM 174. The user equipment 170 contains at least one transceiver that provides a radio link to the radio access network 130 or base station system 160. The user equipment 170 may contain at least two different user identity modules. In addition, the user equipment 170 contains an antenna, a user interface and a battery. Currently, there are different types of user equipment 170, those installed in cars and portable equipment, for instance.

USIM 174 contains user-related information and especially information related to information security, such as an encryption algorithm.

Figure 3:
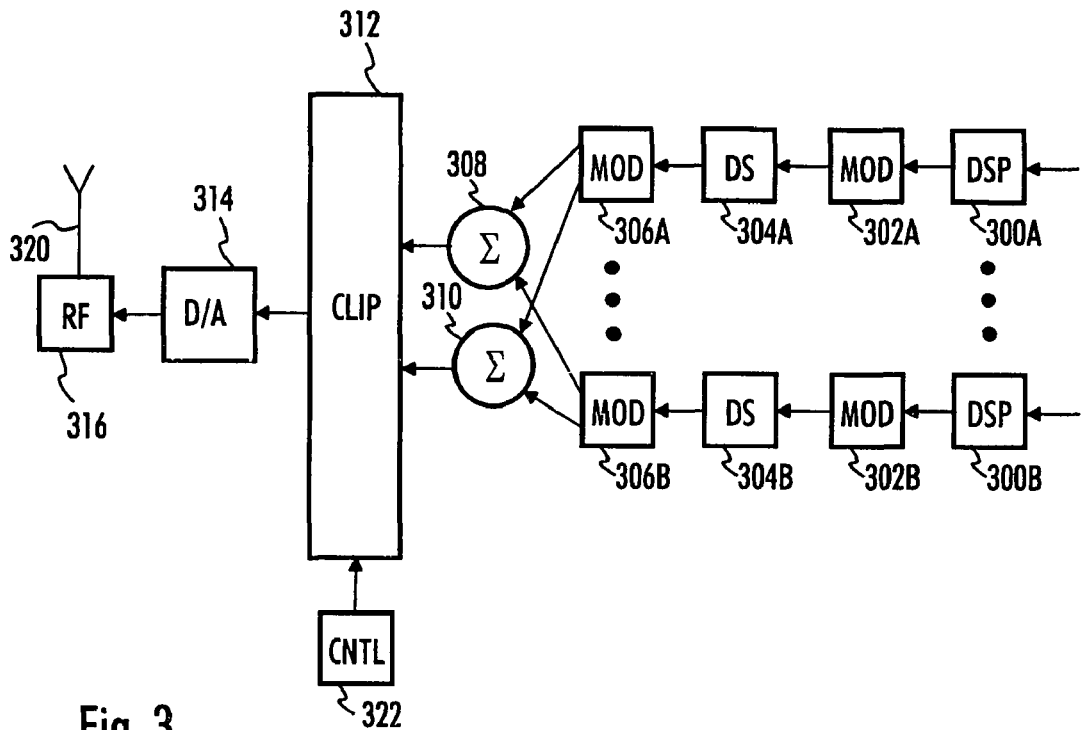
FIG. 3 shows an example of a transmitter.

FIG. 3 shows an example of a transmitter of a data transmission system. The transmitter can be a base station or any other transmitter of a radio system. The transmitter may comprise signal-processing units 300A to 300B, data modulators 302A to 302B, spreading units 304A to 304B, and modulators 306A to 306B. The number of carriers required may vary in different embodiments.

The signal-processing units 300A to 300B, e.g. digital signal processors (DSP), process user speech or data in the transmitter. The data signal is modulated by a desired modulation method in the data modulators 302A to 302B. The narrowband data signal is multiplied by a spreading code in the spreading units 304A to 304B. The modulators 306A to 306B are required when the transmitter is a multicarrier transmitter. The modulators 306A to 306B form a plurality of carriers organized on the frequency domain in a manner applicable to the system used.

The signal may have an in-phase (I) and quadrature (Q) component after each modulator 306A to 306B and, thus, the multicarrier transmitter comprises two adders 308, 310, one of which adds the in-phase components of the different carriers together and the other one adds the quadrature components thereof together.

A clipper module 312 clips the effective strength of the signal exceeding a threshold value. The signal may be a complex signal including an in-phase part and a quadrature-phase part. The strength can be expressed as energy, power or absolute amplitude. The clipper module 312 may also reside before the modulators 306A to 306B. The clipper module 312 outputs the clipped signal to a D/A transformer 314, which converts a signal of a digital form into a signal of an analog form. The radio frequency parts 316 of the transmitter may comprise a mixer that up-converts the signal onto a selected radio frequency either directly or through an intermediate frequency, and an amplifier that amplifies the signal. The antenna 320 transmits the amplified signal.

A control unit 322 controls the functions of the clipper module 312. The control unit 322 may control, for example, the threshold A of clipping (clip limit) and a weight parameter a that can be used in the method. Several parameters can be taken into account when determining the threshold values for clipping, e.g. the allowed bandwidth, the width of the signal frequency band, the required transmit power and the allowed maximum value of the error vector magnitude (EVM), or the maximum value of the peak code domain error used in UMTSs, representing the greatest possible code timing error. Other factors can also be taken into account in setting the threshold value. An example of the structure of a stage of the clipper module 312 will be described below with reference to FIG. 4.

In an embodiment, the clipper module 312 comprises a calculator for forming a clipping signal on the basis of a residual signal of a complex envelope clipper and a respective reference signal thereof. The residual signal is based on a transmission signal to be clipped, and the respective reference signal corresponds to an ideal residual signal. The residual signal is the signal that is subtracted from the original signal in order to limit the peak value. Further, an ideal residual signal is the signal which, when subtracted from the original signal, creates the least EVM for the output signal while achieves the required peak limitation at the same time. The clipper module 312 further comprises an adder for subtracting the clipping signal from the residual signal for removing higher amplitudes of the residual signal, and an adder for subtracting the clipping signal from the reference signal for providing a reference signal respective to the clipped residual signal.

In an embodiment, until a predetermined iteration limit is reached: the calculator is configured to continue forming one or more clipping signals on the basis of the previously clipped residual signals and the respective reference signals thereof, the adder is configured to continue subtracting the formed one or more clipping signals from the respective residual signals, and the adder is configured to continue subtracting the formed one or more clipping signals from the respective reference signals thereof.

In an embodiment, the clipper module 312 further comprises a minimizer for performing minimization of a determined cost function, the cost function being determined for removing the higher amplitudes of the residual signal exceeding a predetermined threshold, and the calculator is further configured to define the clipping signal based on the minimized cost function.

Figure 2:
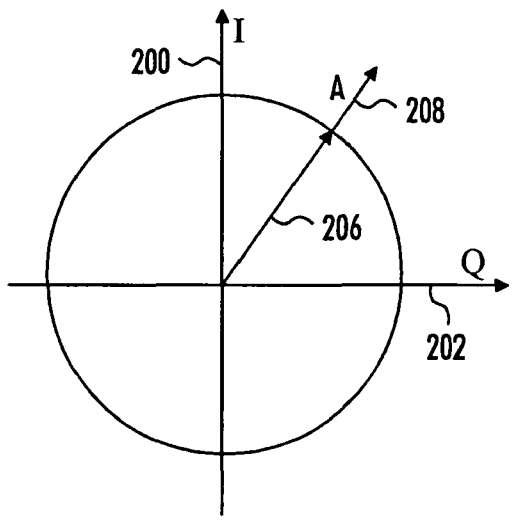
FIG. 2 shows an example of complex envelope clipping.

Let us next study some theoretical basis of a clipping method. First, consider clipping without any frequency constraints, such as SEM or ACLR (adjacent channel leakage power ratio). The target is to clip the transmitted signal as much as possible with as little created EVM as possible. FIG. 2 shows a simple example of complex envelope clipping. The horizontal axis 202 shows a quadrature component of a modulated signal and the vertical axis 200 shows an in-phase component. An arrow 208 denotes an error vector exceeding the threshold A. An arrow 206 denotes a clipped signal vector. It can be seen that a complex envelope clipper minimizes the created EVM for each clip limit A.

The created EVM can be theoretically evaluated as a function of a clip limit. The typical transmit signal can be modeled as a Gaussian random signal. This follows directly from a central limit theorem, such as CDMA, OFDM or multicarrier type of signals. Secondly, consider only the amplitude of the complex signal as the original signal. The clipped signal always has the same phase. Thus, the created EVM can be calculated according to:

$$v_{EVM} = \sqrt{\int_A^\infty (r-A)^2 p(r) dr} \qquad (1)$$

where $$p(r) = \frac{r}{\sigma^2} e^{-r^2/2\sigma^2},$$

A is the clip limit and the expected values $E(r)=\sqrt{(\pi/2)}\sigma$ and $E(r^2)=2\sigma^2$. The resulting PAR can be evaluated as follows. The power of the clipped signal $E(y^2)$ can be evaluated from $E(r^2)=E((y+e)^2)$. As a result, the PAR can be defined as:

$$PAR = 10\log_{10}\left(\frac{\max(y)^2}{E(y^2)}\right) = 10\log_{10}\left(\frac{A^2}{2\sigma^2 - 2AE(e) - E(e^2)}\right) \quad (2)$$

where $$E(e) = \int_A^\infty (r-A)p(r)dr = \sigma\sqrt{\pi/2}\ \text{erfc}\left(A/\sqrt{2}\ \sigma\right) \quad (3)$$

$$E(e^2) = \int_A^\infty (r-A)^2 p(r)dr$$

$$= 2\sigma^2 e^{-A^2/2\sigma^2} - A\sigma\sqrt{2\pi}\ \text{erfc}\left(A/\sqrt{2}\ \sigma\right).$$

Next, the impact of measurement to the created EVM is considered. Typical transmitter specifications define the method to be used for measuring the caused EVM. The method typically includes fitting the amplitude and the phase of the measured signal vector y to the reference signal vector r.

First, a parameter ω, which fits the signals together by minimizing the squared difference $(r-\omega y)^2$ is determined. A slight change to the notation is made and then it is started with complex variables. The solution for a can then be determined as:

$$\omega = \frac{r^H y}{y^H y} = \frac{E(ry)}{E(y^2)} \quad (4)$$

where r is the reference signal vector, y is the measured signal vector, and where the upper indices H of the terms $r^H$ and $y^H$ mean Hermitian forms of matrices R and Y. The elements of a vector or a matrix $a^H$, for example, are complex conjugate transposes of the vector or the matrix a. It can be seen that ω is a real variable, i.e., it follows that the phase can be compensated for ideally and only the amplitude needs to be considered as before. In the following, only the impact of amplitude difference between the reference and clipped signals is considered.

The impact of a measurement error for a complex envelope clipper can be calculated by using the Gaussian approximation. The power of the clipped signal $E(y^2)$ can be evaluated from $E(r^2)=E((y+e)^2)$, and by noting that $E(ye)=AE(e)$. Thus, it can be defined:

$$\omega = \frac{2\sigma^2 - AE(e) - E(e^2)}{2\sigma^2 - 2AE(e) - E(e^2)} \quad (5)$$

Now, the EVM can be evaluated according to:

$$m_{EVM} = \sqrt{\frac{2(1-\omega)^2\sigma^2 + 2\omega(1-\omega)AE(e) - (2\omega - \omega^2)E(e^2)}{2\sigma^2}} \quad (6)$$

In an embodiment, the purpose is to find an iterative clipper that can perform better than the previously known algorithms and with reasonable complexity. First, a cost function that is used in the following derivation of the clipper algorithm is considered. It should be noted that the selected cost function has a large impact on the following algorithmic choices and on the convergence rate of the algorithm. The convergence rate has a direct impact on the implementation complexity of the algorithm.

In order to minimize the maximum amplitude, a cost for high amplitudes is needed. First, a nonlinear function F(·) is defined as follows:

$$F(x,A) = \begin{cases} x & |x| \le A \\ \dfrac{A}{|x|}x & |x| > A \end{cases} \quad (7)$$

This reminds of a complex envelope clipper. As the goal is to achieve a fast convergence rate, the cost function is selected accordingly. Without going to unnecessary details, here the target clipping signal reminds of the residual of the complex envelope clipper, y−F(y,A), and additionally all the peaks exceeding the limit A can be penalized. Matrix G is used to give appropriate frequency characteristics (or any other required characteristics) for the clipper signal and it is here given without any particular form. The cost function can be expressed as:

$$J(x)=\alpha(y-F(y,A)^H-Gx)^H(y-F(y,A)-Gx)+(1-\alpha)\|y-Gx-F(y-Gx,A)_2^2\| \quad (8)$$

where J is a cost function result, y is a measured signal vector, A is the clip limit, α and (1−α) are weights having real values.

Next, different options for finding the values x that minimize J(x) are considered. There are two straightforward solutions: gradient based (LMS) and steepest descent algorithms.

In the gradient-based algorithm, it is proceeded according to a gradient using a fixed step size μ:

$$\hat{x}_{n+1} = \hat{x}_n - \mu \nabla J(\hat{x}_n) \quad (9)$$

where a hat on the argument $\hat{x}$ means an estimate of the variable, and a differential operator ∇ is a gradient.

The above algorithm can provide a low PAR but its convergence rate may be slower compared to the following algorithm based on the steepest descent approach. The steepest descent algorithm minimizes the cost function by solving:

$$\hat{x}_{n+1} = \hat{x}_n - \nabla^2 J(\hat{x}_n)^{-1} \nabla J(\hat{x}_n) \quad (10)$$

Now, it can be defined:

$$\nabla J(\hat{x}_n) = \alpha(-G(y-F(y,A))+G^H Gx)+(1-\alpha)[-G^H(y-GxF(y-Gx,A))] \quad (11)$$

and $$\nabla^2 J(\hat{x}_n) = \alpha G^H G + (1-\alpha)G^H G = G^H G \quad (12)$$

Now we are ready to set up the algorithm according to an embodiment. First, it is noted that in an embodiment, it may be advantageous to search for $Gx_{n+1}$ instead of just $x_{n+1}$, and the algorithm can be defined as:

$$Gx_{n+1}=Gx_n+G(G^H G)^{-1}G^H\times[\alpha(y-Gx_n-F(y,A))+(1-\alpha)(y-Gx_n-F(y-Gx_n,A))] \quad (13)$$

Next, the role of the matrix G is considered. The purpose of the matrix G is to define passband frequency characteristics for the signal. It can be seen that in the clipper iteration the only term related to the matrix G is the term $G(G^H G)^{-1}G^H$, which is a projection matrix, i.e., all its eigenvalues are either one or zero.

There are some different options for implementing the matrix $G(G^H G)^{-1}G^H$ operations:

In the simplest case, the matrix G is just a convolution matrix, which interpolates from the symbol rate to the signal sampling rate. Similarly, $G^H$ is a decimating filter and $(G^H G)^{-1}$ operates at the symbols rate. This term can also be replaced by a filter, for example, by estimating AR parameters for ($G^H G$) and then using them in a FIR filter.

In a multicarrier case, the matrix G can contain several convolution matrices as submatrices and the derivation of the filter responses is somewhat similar.

In the case of OFDM, or, generally, when the data blocks are cyclic, the matrix G or some parts of the filtering can be replaced by FFT. Note that any filter can also be implemented using FFT.

By checking the algorithm of equation (13), it can be seen that the projection matrix defines the frequency characteristics of the clipping signal. In an embodiment, the term $G(G^H G)^{-1} G^H$ can be shaped in such a way that the required response, possibly with some performance loss, is obtained.

Figure 4:
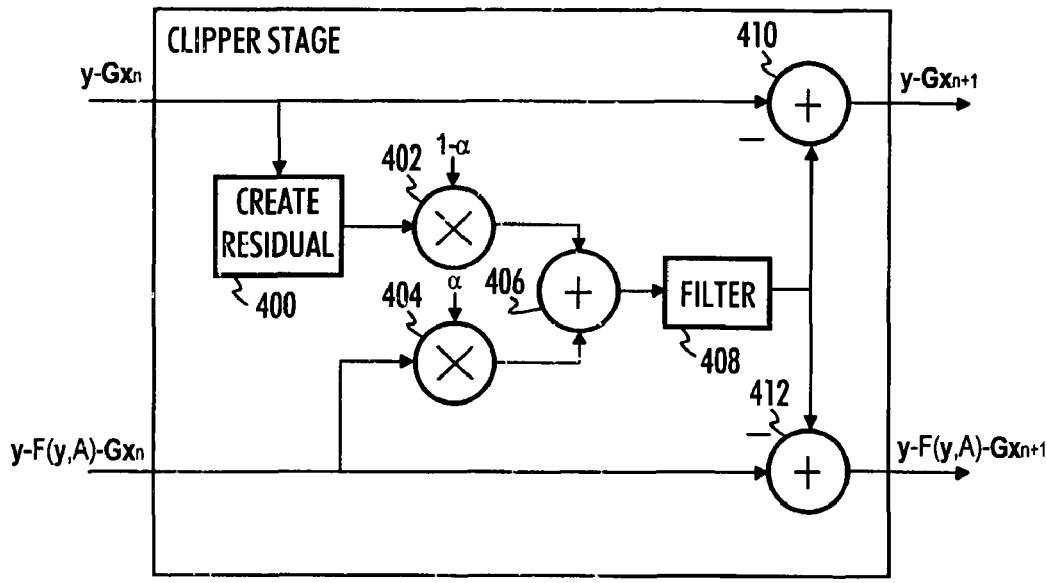
FIG. 4 shows an example of a structure of a clipper stage.

In an embodiment, the clipper is defined as an iterative clipper, but the practical implementation may contain cascaded clipper "stages". FIG. 4 shows an example of a structure of one clipper stage. A filter block 408 contains the term due to projection matrix and it is here assumed to be a filter, several filters or FFT operations. Otherwise, the structure is rather straightforward for implementation. In an embodiment, the resulting $Gx_1$ can sometimes additionally be scaled down in order to guarantee the convergence of the algorithm in the beginning.

In the example of FIG. 4, the signals $y-Gx_n$ and $y-F(y,A)-Gx_n$ are input to the clipper block. The signal $y-Gx_n$ is a residual signal of a complex envelope clipper based on the transmission signal to be clipped, and the signal $y-F(y,A)-Gx_n$ is a reference signal respective to the residual signal. The reference signal $y-F(y,A)-Gx_n$ corresponds to an ideal residual signal. A residual of the signal $y-Gx_n$ is created in block 400, after which the residual signal is weighted with a real value $1-\alpha$ in a weight unit 402. The reference signal $y-F(y,A)-Gx_n$ is weighted with a real value $\alpha$ in a weight unit 404. The signals from the weight units 402 and 404 are then summed in a summer 406 that outputs an optimization signal. The optimization signal is filtered in a filter block 408 that can be expressed, for example, as a convolution matrix G. In the summers 410 and 412, the clipping signal $Gx_{n+1}$ output by the filter block 408 is subtracted from the inputted signals $y-Gx_n$ and $y-F(y,A)-Gx_n$, and the signals output by the summers 410 and 412 can be expressed as $y-Gx_{n+1}$ and $y-F(y,A)-Gx_{n+1}$.

Figure 5:
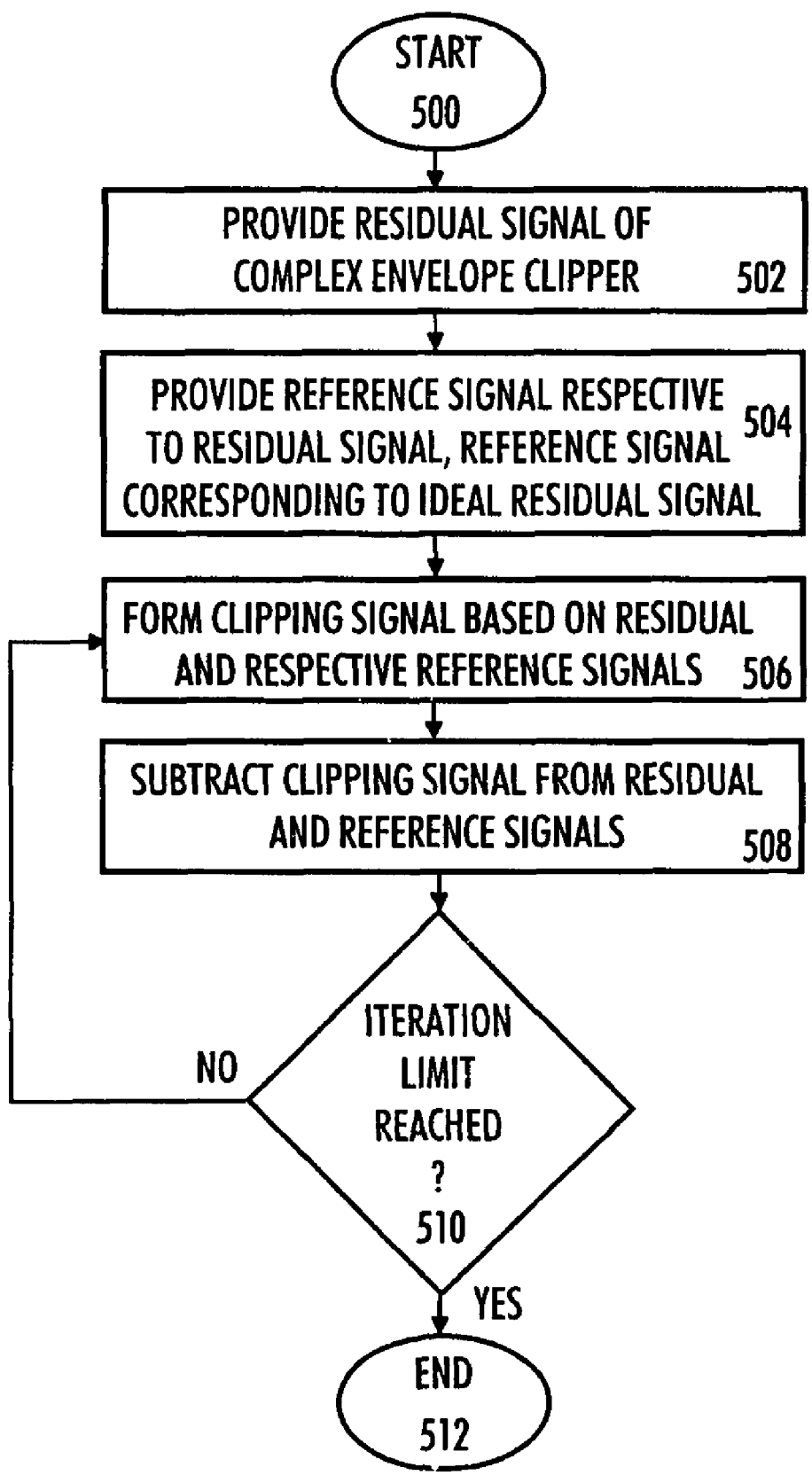
FIG. 5 shows an embodiment of the method of clipping a transmission signal.

FIG. 5 shows an embodiment of the method of clipping a transmission signal. The method starts in 500. In 502, a residual signal of a complex envelope clipper based on the transmission signal to be clipped is provided. In 504, a reference signal respective to the residual signal is provided. The reference signal corresponds to an ideal residual signal. In 506, a clipping signal is formed on the basis of the residual signal and the reference signal. In 508, the clipping signal is subtracted from the residual signal for removing higher amplitudes of the residual signal and from the reference signal for providing a reference signal respective to the clipped residual signal. If, in 510, it is detected that a predetermined iteration limit is reached, then the method ends in 512. Otherwise, it is continued forming clipping signals on the basis of the previously clipped residual signals and the respective reference signals thereof, and subtracting the formed clipping signals from the respective residual signals and the respective reference signals thereof until the predetermined iteration limit is reached.

The embodiments of the invention may be realized in one or more clipper modules of a transmitter, comprising a controller. The controller may be configured to perform at least some of the steps described in connection with the flowchart of FIG. 5. The embodiments may be implemented as a computer program comprising instructions for executing a computer process for clipping a transmission signal. The process comprises: providing a residual signal of a complex envelope clipper based on the transmission signal to be clipped; providing a reference signal respective to the residual signal, the reference signal corresponding to an ideal residual signal; forming a clipping signal on the basis of the residual signal and the reference signal; subtracting the clipping signal from the residual signal for removing higher amplitudes of the residual signal; and subtracting the clipping signal from the reference signal for providing a reference signal respective to the clipped residual signal.

The computer program may be stored on a computer-readable program distribution medium having stored thereon a data structure, comprising instructions for executing a computer process for clipping a transmission signal. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims.

The invention claimed is:

1. A method, comprising:
providing, by a controller, a residual signal of a complex envelope clipper based on a transmission signal to be clipped;
providing by the controller a reference signal respective to the residual signal, the reference signal corresponding to an ideal residual signal;
forming, by the controller, a clipping signal on the basis of the residual signal and the reference signal;
subtracting, by the controller, the clipping signal from the residual signal for removing higher amplitudes of the residual signal; and
subtracting, by the controller, the clipping signal from the reference signal for providing a reference signal respective to the clipped residual signal, thereby clipping the transmission signal.

2. The method of claim 1, further comprising:
predetermining an iteration limit; and
continuing forming one or more clipping signals on the basis of the previously clipped residual signals and the respective reference signals thereof, and continuing subtracting the formed one or more clipping signals from the respective residual signals and the respective reference signals thereof until the predetermined iteration limit is reached.

3. The method of claim 1, further comprising:
determining a cost function for removing the higher amplitudes of the residual signal exceeding a predetermined threshold;
performing a minimization of the determined cost function; and
defining the clipping signal based on the minimized cost function.

4. The method of claim 3, forming the determined cost function as $$J(x) = \alpha(y-F(y,A)^H-Gx)^H(y-F(y,A)-Gx)+(1-\alpha)\|y-Gx-F(y-Gx,A)_2^2\|,$$

wherein J is a cost function result, y is a signal vector of the transmission signal to be clipped, x is a value to minimize J(x), A is a threshold value indicating a clip limit, $\alpha$ and $(1-\alpha)$ are weights having real values, G is a matrix for providing frequency characteristics for the clipped signal, y-F(y,A) is a residual signal vector of the complex envelope clipper, and operator H indicates a complex conjugate transpose of a matrix.

5. The method of claim 3, further comprising: performing the minimization of the cost function by using at least one of a gradient based algorithm or a steepest descent algorithm.

6. The method of claim 1, further comprising: setting a threshold value for removing the higher amplitudes of the residual signal.

7. The method of claim 1, further comprising: performing weighting of the residual signal and the respective reference signal.

8. The method of claim 1, further comprising: performing filtering of the sum of the residual signal and the respective reference signal for forming the clipping signal.

9. The method of claim 8, further comprising: using a matrix for performing the filtering, the matrix comprising one or more convolution matrices.

10. The method of claim 8, further comprising: implementing at least a part of the filtering by using fast Fourier transform.

11. The method of claim 1, further comprising: forming the clipping signal on the basis of a clipping algorithm having the form of:

$$Gx_{n+1} = Gx_n + G(G^HG)^{-1}G^H \times [\alpha(y-Gx_n-F(y,A))+(1-\alpha)(y-Gx_n-F(y-Gx_n,A))]$$

wherein y is a signal vector of the transmission signal to be clipped, A is a threshold value indicating a clip limit, $\alpha$ and $(1-\alpha)$ are weights having real values, G is a matrix for providing frequency characteristics for the clipped signal, x is a real value, operator H indicates a complex conjugate transpose of a matrix, and $G(G^HG)^-G^H$ is a projection matrix.

12. An apparatus, comprising:
a calculator configured to form a clipping signal on the basis of a residual signal of a complex envelope clipper and a respective reference signal thereof, the residual signal being based on a transmission signal to be clipped, and the respective reference signal corresponding to an ideal residual signal;
an adder configured to subtract the clipping signal from the residual signal for removing higher amplitudes of the residual signal; and
a reference adder configured to subtract the clipping signal from the reference signal to provide a reference signal respective to the clipped residual signal.

13. The apparatus of claim 12, wherein, until a predetermined iteration limit is reached,
the calculator is configured to continue forming one or more clipping signals on the basis of the previously clipped residual signals and the respective reference signals thereof,
the adder is configured to continue subtracting the formed one or more clipping signals from the respective residual signals, and the reference adder is configured to continue subtracting the formed one or more clipping signals from the respective reference signals thereof.

14. The apparatus of claim 12, wherein the clipper module further comprises a minimizer configured to perform minimization of a determined cost function, the cost function being determined for removing the higher amplitudes of the residual signal exceeding a predetermined threshold, and the calculator is further configured to define the clipping signal based on the minimized cost function.

15. The apparatus of claim 14, wherein the cost function has a form of:

$$J(x) = \alpha(y-F(y,A)^H-Gx)^H(y-F(y,A)-Gx)+(1-\alpha)\|y-Gx-F(y-Gx,A)_2^2\|$$

wherein J is a cost function result, y is a signal vector of the transmission signal to be clipped, x is a value to minimize J(x), A is a threshold value indicating a clip limit, $\alpha$ and $(1-\alpha)$ are weights having real values, G is a matrix for providing frequency characteristics for the clipped signal, y −F(y, A) is the residual signal vector of the complex envelope clipper, and operator H indicates a complex conjugate transpose of a matrix.

16. The apparatus of claim 14, wherein the minimizer is configured to use at least one of a gradient based algorithm or a steepest descent algorithm for performing the minimization of the cost function.

17. The apparatus of claim 12, wherein the apparatus further comprises a control unit configured to set a threshold value for removing the higher amplitudes of the residual signal.

18. The apparatus of claim 12, wherein the apparatus further comprises a weighting unit configured to perform weighting of the residual signal and the respective reference signal.

19. The apparatus of claim 12, wherein the apparatus further comprises a filter configured to filter the sum of the residual signal and the respective reference signal for forming the clipping signal.

20. The apparatus of claim 19, wherein the filter is configured to use a matrix for performing the filtering, the matrix comprising one or more convolution matrices.

21. The apparatus of claim 19, wherein the filter is configured to implement at least a part of the filtering by using fast Fourier transform.

22. The apparatus of claim 12, wherein the calculator is configured to form the clipping signal on the basis of a clipping algorithm having the form of:

$$Gx_{n+1} = Gx_n + G(G^HG)^{-1}G^H \times [\alpha(y-Gx_n-F(y,A))+(1-\alpha)(y-Gx_n-F(y-Gx_n,A))]$$

wherein y is a signal vector of the transmission signal to be clipped, A is a threshold value indicating a clip limit, $\alpha$ and $(1-\alpha)$ are weights having real values, G is a matrix for providing frequency characteristics for the clipped signal, x is a real value, operator H indicates a complex conjugate transpose of a matrix, and $G(G^HG)^{-1}G^H$ is a projection matrix.

23. An apparatus, comprising:
a transmitter unit configured to transmit a clipped transmission signal;
one or more clipper modules comprising a calculator configured to form a clipping signal on the basis of a residual signal of a complex envelope clipper and a respective reference signal thereof, the residual signal being based on a transmission signal to be clipped, and the respective reference signal corresponding to an ideal residual signal,
an adder configured to subtract the clipping signal from the residual signal for removing higher amplitudes of the residual signal, and a reference adder configured to subtract the clipping signal from the reference signal to provide a reference signal respective to the clipped residual signal.

24. The apparatus of claim 23, wherein, until a predetermined iteration limit is reached,
the calculator of the one or more clipper modules is configured to continue forming one or more clipping signals on the basis of the previously clipped residual signals and the respective reference signals,
the adder of the one or more clipper modules is configured to continue subtracting the formed one or more clipping signals from the respective residual signals, and
the reference adder of the one or more clipper modules is configured to continue subtracting the formed one or more clipping signals from the respective reference signals thereof.

25. The apparatus of claim 23, wherein the calculator of the one or more clipper modules is configured to form the clipping signal on the basis of a clipping algorithm having the form of:

$$Gx_{n+1}=Gx_n+G(G^HG)^{-1}G^H\times[\alpha(y-Gx_n-F(y,A))+(1-\alpha)(y-Gx_n-F(y-Gx_n,A))]$$

wherein y is a signal vector of the transmission signal to be clipped, A is a threshold value indicating a clip limit, $\alpha$ and $(1-\alpha)$ are weights having real values, G is a matrix for providing frequency characteristics for the clipped signal, x is a real value, operator H indicates a complex conjugate transpose of a matrix, and $G(G^HG)^{-1}G^H$ is a projection matrix.

26. A non-transitory computer program product embodied on a computer readable medium, the non-transitory computer program product comprising instructions for executing a computer process for clipping a transmission signal, the process comprising:
providing a residual signal of a complex envelope clipper based on the transmission signal to be clipped;
providing a reference signal respective to the residual signal, the reference signal corresponding to an ideal residual signal;
forming a clipping signal on the basis of the residual signal and the reference signal;
subtracting the clipping signal from the residual signal for removing higher amplitudes of the residual signal; and
subtracting the clipping signal from the reference signal for providing a reference signal respective to the clipped residual signal, thereby clipping the transmission signal.

27. The non-transitory computer program product of claim 26, the process further comprising:
predetermining an iteration limit; and
continuing forming one or more clipping signals on the basis of the previously clipped residual signals and the respective reference signals thereof, and continuing subtracting the formed one or more clipping signals from the respective residual signals and the respective reference signals thereof until the predetermined iteration limit is reached.

28. The non-transitory computer program product of claim 26, the process further comprising forming the clipping signal on the basis of a clipping algorithm having the form of:

$$Gx_{n+1}=Gx_n+G(G^HG)^{-1}G^H\times[\alpha(y-Gx_n-F(y,A))+(1-\alpha)(y-Gx_n-F(y-Gx_n,A))]$$

wherein y is a signal vector of the transmission signal to be clipped, A is a threshold value indicating a clip limit, $\alpha$ and $(1-\alpha)$ are weights having real values, G is a matrix for providing frequency characteristics for the clipped signal, x is a real value, operator H indicates a complex conjugate transpose of a matrix, and $G(G^HG)^{-1}G^H$ is a projection matrix.

29. A program product embodied on a non-transitory computer-readable medium having stored thereon a data structure, the program product comprising instructions for executing a computer process for clipping a transmission signal, the process comprising:
providing a residual signal of a complex envelope clipper based on the transmission signal to be clipped;
providing a reference signal respective to the residual signal, the reference signal corresponding to an ideal residual signal;
forming a clipping signal on the basis of the residual signal and the reference signal;
subtracting the clipping signal from the residual signal for removing higher amplitudes of the residual signal; and
subtracting the clipping signal from the reference signal for providing a reference signal respective to the clipped residual signal, thereby clipping the transmission signal.

30. The non-transitory computer-readable medium of claim 29, the medium including at least one of the following media: a computer readable medium, a program storage medium, a record medium, or a computer readable memory.

31. The non-transitory computer-readable medium of claim 29, the process further comprising:
predetermining an iteration limit; and
continuing forming one or more clipping signals on the basis of the previously clipped residual signals and the respective reference signals thereof, and continuing subtracting the formed one or more clipping signals from the respective residual signals and the respective reference signals thereof until the predetermined iteration limit is reached.

32. A clipper module, comprising:
calculating means for forming a clipping signal on the basis of a residual signal of a complex envelope clipper and a respective reference signal thereof, the residual signal being based on a transmission signal to be clipped, and the respective reference signal corresponding to an ideal residual signal;
subtracting means for subtracting the clipping signal from the residual signal for removing higher amplitudes of the residual signal; and
reference subtracting means for subtracting the clipping signal from the reference signal for providing a reference signal respective to the clipped residual signal, thereby clipping the transmission signal.

33. The clipper module of claim 32, wherein the clipper module comprises calculating means for forming the clipping signal on the basis of a clipping algorithm having the form of:

$$Gx_{n+1}=Gx_n+G(G^HG)^{-1}G^H\times[\alpha(y-Gx_n-F(y,A))+(1-\alpha)(y-Gx_n-F(y-Gx_n,A))]$$

wherein y is a signal vector of the transmission signal to be clipped, A is a threshold value indicating a clip limit, $\alpha$ and $(1-\alpha)$ are weights having real values, G is a matrix for providing frequency characteristics for the clipped signal, x is a real value, operator H indicates a complex conjugate transpose of a matrix, and $G(G^HG)^{-1}G^H$ is a projection matrix.

* * * * *